United States Patent
Quakernack et al.

(10) Patent No.: US 11,012,090 B2
(45) Date of Patent: May 18, 2021

(54) EMBEDDED CYCLICAL REDUNDANCY CHECK VALUES

(71) Applicant: WAGO Verwaltungsgesellschaft mbH, Minden (DE)

(72) Inventors: Frank Quakernack, Bielefeld (DE); Daniel Jerolm, Bad Essen (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 16/694,214

(22) Filed: Nov. 25, 2019

(65) Prior Publication Data
US 2020/0091931 A1    Mar. 19, 2020

Related U.S. Application Data

(63) Continuation of application No. PCT/EP2018/062904, filed on May 17, 2018.

(30) Foreign Application Priority Data

May 24, 2017   (DE) ...................... 10 2017 208 826.5

(51) Int. Cl.
*H03M 13/09*        (2006.01)
*H04L 1/00*         (2006.01)

(52) U.S. Cl.
CPC .......... *H03M 13/09* (2013.01); *H04L 1/0061* (2013.01)

(58) Field of Classification Search
CPC .. H03M 13/09; H03M 13/096; H03M 13/098; H03M 13/611; H04L 1/0011; H04L 1/0007; H04L 1/0061; G06F 11/10
See application file for complete search history.

(56) References Cited

U.S. PATENT DOCUMENTS 5,598,424 A * 1/1997 Erickson ................. G06F 11/10
                                                 714/704
5,754,564 A * 5/1998 Francis .................... G06F 11/10
                                                 714/752
(Continued)

FOREIGN PATENT DOCUMENTS

WO   WO-2008073494 A1 *  6/2008   ............ H04L 1/0011
WO       WO2008073494 A1    6/2008

OTHER PUBLICATIONS

Lin Cui et al; Partial CRC Checksum of SCTP for Error Control over Wireless Networks; published online Jun. 20, 2008 Springer Science+Business Media, LLC 2008.

(Continued)

*Primary Examiner* — Shelly A Chase
(74) *Attorney, Agent, or Firm* — Muncy, Geissler, Olds & Lowe, P.C.

(57) ABSTRACT

A method and a device for generating a data packet to be transmitted comprising data and at least one value for a cyclic redundancy check (CRC) value, are described, wherein the CRC value is generated using at least one previously determined polynomial on the basis of at least some of the data and the method comprises initializing a counter value, counting units of data, wherein the counter value changes for each unit of data, and adding a CRC value into the data packet, when the counter value reaches a reference value or all units of data in the data packet have already been counted, wherein the CRC value is generated over the units of data which have been counted since the counter value last reached the reference value or since the counter value was initialized. Furthermore, a method and a device for checking a corresponding received data packet are described.

14 Claims, 5 Drawing Sheets

(56) References Cited

U.S. PATENT DOCUMENTS

| | | |
|---|---|---|
| 7,360,142 B1 | 4/2008 | Barash |
| 7,496,825 B2 * | 2/2009 | Degn .................... H03M 13/09 |
| | | 714/784 |
| 7,881,303 B2 | 2/2011 | Hughes et al. |
| 2010/0192048 A1 | 7/2010 | Washio et al. |

OTHER PUBLICATIONS

International preliminary report on patentability dated Nov. 26, 2019 in corresponding application PCT/EP2018/062904.
International Search Report dated Aug. 21, 2018 in corresponding application PCT/EP2018/062904.

* cited by examiner

EMBEDDED CYCLICAL REDUNDANCY CHECK VALUES

This nonprovisional application is a continuation of International Application No. PCT/EP2018/062904, which was filed on May 17, 2018, and which claims priority to German Patent Application No. 10 2017 208 826.5, which was filed in Germany on May 24, 2017, and which are both herein incorporated by reference.

BACKGROUND OF THE INVENTION

Field of the Invention

The present invention relates to cyclic redundancy check values, CRC values, and in particular to cyclic redundancy check values embedded in data packets.

Description of the Background Art

A cyclic redundancy check is used in the transmission of data packets. It is used to detect errors in the transmission of data packets and to sort out or, if necessary, to correct erroneous data packets.

In this case, before the transmission of the data packet, additional redundancy is added to the data packet in the form of a so-called redundancy check value or, for short, CRC value. This CRC value is a test value calculated from the data packet data according to a specific process, with the help of which possible errors arising during the transmission can be detected. The CRC value itself has no information content beyond that already contained in the underlying data packet. The CRC value is accordingly redundant.

The calculation methods for calculating the CRC value are based on cyclic codes. These are block codes that have the property that every cyclic shift of the bits of a valid code word is also a valid code word. Mathematically, the calculation of the CRC value is based on dyadic polynomials in which the data of the data packet are mapped. This dyadic polynomial is divided by a CRC generator polynomial, also referred to as a CRC polynomial, and the remainder of this polynomial division gives the CRC value appended to the data packet. If the data packet with the CRC value is transmitted without errors and is also divided by the CRC polynomial on the receiver side for checking, a remainder of zero results. If an error has occurred during the transmission, a remainder different from zero results. The polynomial division needed to generate and check the CRC value can be realized very easily in hardware through the use of XOR gates.

Each CRC polynomial has a so-called "Hamming distance." This specifies the maximum amount of data that may be present in order for the CRC value generated from the data to be unique. If more data are used with the CRC polynomial to generate the CRC value than the Hamming distance allows, it may happen that the data are recognized as valid even though they are faulty. This is based on the fact that in this case the CRC value is no longer unique.

In many transmissions, therefore, fixed sizes of data packets are used, thus, data packets with a certain fixed number of data, and a CRC polynomial is used which has a Hamming distance that matches the number of data in the data packet, so that a unique CRC value can be calculated.

If data packets with non-fixed size are to be used, thus, data packets in which the number of data is not fixed, a CRC polynomial is usually used which has a Hamming distance designed for the maximum number of data in a data packet. The CRC polynomial is thus also used if the data packet does not always reach this maximum number of data.

In such methods, therefore, there is no response to the different number of data in data packets. Either the selected CRC polynomial has a too small Hamming distance for the number of data in a data packet, or unnecessarily additional effort is constantly generated by a CRC polynomial with an unnecessarily large Hamming distance. It should be noted that the greater the Hamming distance, the greater the computational effort needed to calculate the CRC value and to perform the check or the greater the hardware needs for XOR gates.

SUMMARY OF THE INVENTION

It is therefore an object of the present invention to allow a redundancy check of data packets, wherein the data packets may have a variable length. As such, a method and a device are provided for generating a data packet with cyclic redundancy check values, CRC values, and by a corresponding method and device for receiving and checking such a data packet with cyclic redundancy check values.

According to an exemplary embodiment of the method of the invention, at least one CRC value is embedded in a data packet, and then a check of the data packet and its error-free transmission is possible with this embedded CRC value. Depending on the number of data in the data packet, at least one or more CRC values are embedded or added into the data packet.

In this case, the method of the invention for generating a data packet to be transmitted comprising data and at least one value for a cyclic redundancy check comprises initializing a counter value, counting units of data, wherein the counter value changes for each unit of data, and adding a CRC value into the data when the counter value has reached a reference value or all units of data in the data packet have already been counted, wherein the CRC value is generated over the units of data which have been counted since the counter last reached the reference value or since the counter value was initialized. In other words, the method of the invention counts units of data in the data packet; for example, a unit is a fixed number of bits. For example, this fixed number of bits can be one byte. If a previously determined number of units has been counted, therefore, the counter value has reached a certain reference value, then a CRC value is generated over the counted units and added into the data packet. Counting can be based on the counter value being incremented or decremented. Subsequently, a previously determined amount of units is counted again and a CRC value is again added into the data packet, wherein this CRC value is generated over the counted units since the last addition of a CRC value. Counting can again comprise incrementing or decrementing the counter value. If the counter value does not reach the previously determined amount of units, therefore, the reference value, but the beginning or end of the data packet, a CRC value is then added which is generated from the rest of the units of data, therefore, the remaining payload data and the control data of the header of the data packet. The beginning or end of the data packet can be determined, for example, by the detection of specific data. For example, it can be detected that control data are available; i.e., the data packet header has been reached. In this case, all control data of the header or only some of the control data can be taken into account for the CRC value. The end of the data packet can also be detected, for example, by the fact that the length of the data packet is known because the length is, for example, part of the data packet header.

The method of the invention therefore embeds at least one CRC value in the data packet, wherein said embedded CRC value is always generated over a previously determined amount of units of data or the remaining units of data, wherein the previously determined amount of data can be correlated with the Hamming distance of the at least one CRC polynomial used for the CRC value. That is, it is preferable to never use more units of data to generate a CRC value than the Hamming distance allows, no matter how long the data packet is. One can deviate from this for a small amount of data; for example, the counter value can only count the payload data, but if this is reached at the end of the payload data and the rest only formed of the data packet header, the CRC value can also be generated over the header or at least over part of the data packet header.

The method of the invention has the advantage that only one counter value must be present, which is changed according to the number of units of the data, and when a reference value or a remainder of the data is reached, a CRC value is added into the data packet. In this case, the same CRC polynomial can always be used, even if the number of data is variable. That is, only a marginal additional effort is required in comparison with using a CRC polynomial with a higher Hamming distance. In addition, arising errors can be localized better, so that a complete data packet need not be discarded, but only a part of the data packet, namely the part whose CRC value check indicates an error.

The CRC values can be added into the data packet each immediately adjacent to the units of data on the basis of which they are generated. That is, the CRC values are added either before or after the units of data in the data packet on the basis of which they were generated. In this context, one can also speak of embedded CRC values.

A unit of data can be a fixed number of bits, for example, a byte. However, the skilled artisan is aware that any definition of the units of data can also be used. The unit only has to be quantifiable and countable.

The counter value can be set to a previously determined binary value at initialization. For example, this previously determined binary value can be a multiple of the amount of units of data over which a CRC value is to be generated, i.e., a multiple of the reference value. However, it is also conceivable that the counter value is set to the length of the data packet if the length is stored, for example, in the data packet header or elsewhere in the data packet. The reference value used to identify the quantity of counted units of data can have zeros at the least significant positions or only zeros in its binary value representation. Subsequently, when the units of data are counted, the counter value is decremented. If the counter value has zero values at a number of the least significant positions corresponding to the number of least significant positions with zeros of the reference value, then this indicates that a certain amount of units of data has been counted. The amount of counted data is equal to the reference value. For example, the method of the invention can be set up to add a CRC value into the data packet every 2048 units of data; the binary representation of this number corresponds to 100000000000 (11 zeros). That is, every time the 11 least significant positions of the binary counter value indicate zero, a CRC value is added which is generated over the last counted 2048 units of data. In this case, a unit of data can be one byte. This means that, for example, 2048 bytes can be counted. However, the skilled artisan is aware that any other number of units of data can also be counted and that the number is indicated by the corresponding number of zeroes at the least significant positions of the counter value. Such a comparison can also be referred to as a zero-crossing comparison.

The CRC values can all be generated using the same CRC polynomial. This has the advantage that only one hardware circuit has to be provided, which can be used iteratively. Alternatively, however, the CRC values can also be generated with different CRC polynomials. In this case, either all CRC values can be generated with different CRC polynomials, or a previously determined number of CRC polynomials can be used. For example, two different CRC polynomials can be used and the CRC values each can be generated alternately with one of the two CRC polynomials. If these CRC polynomials have different Hamming distances, other reference values can also be used. In this case, a reference value of the Hamming distance can correspond to the currently used CRC polynomial. For example, CRC polynomials with a Hamming distance of 2048 bytes or 4092 bytes, such as the Castagnoli polynomial, can be used. However, the skilled artisan is aware that any CRC polynomial can be used, but that the associated reference value must be matched to the Hamming distance of the CRC polynomial used.

The units of data can be payload data and/or header data. The embedded CRC values can accordingly be generated on the basis of payload data as well as header data, therefore, control data, of the data packet. This enables a complete check of the data packet including the control data.

The generated data packet with the embedded CRC values is contained in a cycle frame. The data packet can also be called a telegram. A cycle frame is used, for example, when the data packet or multiple data packets are to be sent on a ring bus. In this case, a cycle frame can be defined as a recurring (cyclic) preferably equidistant time interval in which data is transferable on the ring bus. The cycle frame has, for example, at least one start identifier (SOC) and a time range for the transmission of data. Multiple start identifiers (SOC) of successive cycle frames are advantageously spaced equidistant in time from one another. The named time range is provided for the transmission of the data packets. The start identifier (SOC) and the data packets are transmitted via the ring bus and pass through all data bus users of the ring bus. The start identifier (SOC) is separate, therefore, transferable as an independent symbol, or advantageously is contained in a start data packet (SOC packet). Within the time range of the cycle frame, no, one, or multiple data packets are transmitted. Advantageously, idle data are added into a cycle frame, in particular adjacent to at least one data packet. Advantageously, the transmission of the data packets and/or idle data causes an uninterrupted signal on the ring bus. The signal enables the data bus users to synchronize to it in terms of time. Advantageously, the cycle frame additionally has a trailer. The trailer has a variable length and follows the time range for data transmission preferably to the next start identifier (SOC) of the next cycle frame. Advantageously, the trailer has idle data.

The data packets transmitted in the cycle frame are preferably originally generated by a local bus master and sent to the data bus users via the ring bus. When generating, the local bus master can insert process data received from the controller, for example, from a PLC, into a data packet. However, the data packet can also contain process data from the local bus master itself and/or from the controller. The data packet and thus the process data and CRC values contained therein then pass stepwise through the individual data bus users of the ring bus. In this case, the data packet can have a plurality of symbols, wherein each symbol has a specific number of bits, for example, 8 bits, therefore 1 byte. The data packet accordingly passes through the data bus users in units, pieces, or parts, for example, in the form of symbols. Accordingly, the data bus users always have only a part of the data packet available at any given time. Therefore, if data are mentioned here, this can also mean a symbol of the data packet that is currently passing through the ring bus.

A data packet which carries process data can also be called a process data packet. The process data packet has the process data that are sent and/or received by the data bus users of the local bus. Advantageously, the process data packet has no address for transmitting the process data to or from a data bus user in the local bus. In the process data packet, the process data are arranged such that data bus users can detect the process data associated with the respective data bus user based on the respective position of the process data in the process data packet, for example, one or more bits within an associated contiguous data block (1 byte). Advantageously, the process data packet has an identifier (IDE) which is assigned to the type of the data packet, therefore, to the process data packet, and is identifiable by the data bus user. However, a data packet can also be a communication data packet which has no process data and in particular serves for programming and/or for controlling and/or for monitoring and/or for identifying at least one data bus user. Advantageously, the communication data packet has an address which is assigned to at least one data bus user. Preferably, the data bus user is set up to evaluate the address and to process the communication data packet accordingly.

In the case of the data packets used in the cycle frame, the CRC values embedded according to the invention are essential and have the advantage that the length of the data packets and thus the length of the process data to be sent are not limited to a certain number, specified by the Hamming distance, of a corresponding CRC polynomial. It is also advantageous that the data bus users are enabled to check only a part of the data packets, namely in each case the parts over which the respective CRC value was generated, without the data bus user having to have the entire data packet available. This in turn means that the data bus user has a lower memory requirement than if it had to buffer the entire data packet for checking.

The object forming the basis of the invention is also achieved by a device for generating a data packet to be transmitted comprising data and at least one value for the cyclic redundancy check. In this case, the at least one CRC value is generated using at least one previously determined polynomial on the basis of at least some of the data. The device comprises an initializer for initializing a counter value, a counter for counting units of data, wherein the counter is adapted to change the count value for each unit of data, a generator for generating a CRC value, and an adder for adding the at least one CRC value into the data packet. In this case, the counter for counting units of data is adapted to change the counter value based on the counted units of data. In this case, the device can furthermore have a display for displaying the counter value. The generator for generating a CRC value can be adapted to generate the CRC value over the counted units of data since the counter value last reached the reference value or the counter value was initialized. Furthermore, the device can have an output for outputting the counter value. In this case, the output can be implemented in an arithmetic logic unit, an arithmetic circuit, a microcontroller, or another digital logic circuit which is formed as part of a semiconductor chip and implemented in an integrated circuit (ASIC), or in a field programmable (logic) gate array (FPGA), or in another programmable circuit (PLD), or a discrete gate or transistor logic.

The object forming the basis of the invention is also achieved by a method for checking a received data packet with at least one value for the cyclic redundancy check, CRC value. In this case, the at least one CRC value has been generated using at least one previously determined polynomial on the basis of at least some of the data and added into the data packet. The method comprises initializing a counter value, counting units of data from the received data packet, wherein the counter value changes for each unit of data, and detecting a CRC value in the data when the counter value has reached a reference value or all units of data in the data packet have already been counted, and checking the detected CRC value. The CRC value can be checked using a polynomial division with the known CRC polynomial. In this case, the data associated with the respective CRC value are received without errors if the polynomial division in each case indicates a remainder of zero. The entire data packet is received without errors if all checks do not show any error; i.e., all polynomial divisions carried out each have a remainder of zero.

The counter value can be set to a previously determined binary value during initialization and wherein, when the units of data are counted, the counter value is decremented and the reference value is a binary value with zero values at the least significant positions. This has the result that whenever the counter value in a zero-crossing comparison indicates that a certain amount of units of data has been counted, it is detected that there is a CRC value that can be checked.

The checking of the CRC values can be carried out in each case using the same CRC polynomial.

The data packet to be checked can be contained in a cycle frame, and the method further comprises receiving the data packet from a data bus user.

The object forming the basis of the invention is also achieved by a method for checking a received data packet with data and with at least one value for the cyclic redundancy check, CRC value. In this case, a first CRC value is generated using at least one previously determined polynomial based on at least a first part of the data, and a second CRC value is generated using the previously determined polynomial on the basis of at least a second part of the data. The method comprises initializing a counter value, counting units of the first part of data from the received data packet, wherein the counter value changes for each unit of data, detecting the first CRC value in the data, when the counter value has reached a reference value, detecting the second CRC value in the data when all units of data in the data packet have already been counted, and checking the detected CRC values. In this case, it can be detected, for example, that the data packet was received without errors if all checks of the detected CRC values do not show any errors.

The counter value can be set to a binary value during initialization; the binary value in this case can depend on the length of the data packet, for example. The length of the data packet can be known, for example, from the data packet header. When the units are counted, the counter value is decremented, for example, and is compared with the reference value, which has, for example, only zero values.

The object forming the basis of the invention is also achieved by a device for checking a received data packet with at least one value for the cyclic redundancy check, CRC value. In this case, the CRC value has been generated using at least one previously determined polynomial on the basis of at least some of the data and added into the data packet.

The device comprises a receiver for receiving a data packet, an initializer for initializing a counter value, a counter for counting units of data from the received data packet, wherein the counter value changes for each unit of data, a detector for detecting a CRC value in the data of the data packet when the counter value has reached a reference value or all units of data in the data packet have already been counted, and a checker for checking the detected CRCs.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
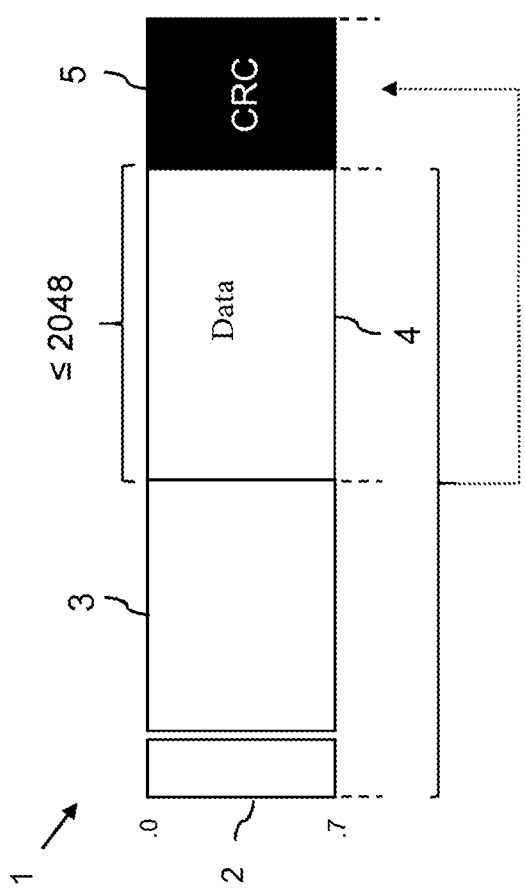
FIG. 1 shows an exemplary data packet with a CRC value.

FIG. 1 shows by way of example a data packet 1 with a header formed of a biunique bit pattern 2 and a control data part 3. The biunique bit pattern 2 is a bit pattern occurring only once and marks the beginning of a data packet 1. Such a bit pattern 2 can also be referred to as a code word or identifier. The formation of unique bit patterns 2 or code words in this case depends on the coding with which data packet 1 is sent. Control data part 3 can include control data containing information regarding data packet 1 or other information that can be used by the receiver(s) of data packet 1. The skilled artisan is familiar with a plurality of control data which can be contained in a data packet 1.

The information part of data packet 1 comprises data 4, which can also be referred to as payload data or process data and which are suitable for bringing about control, regulation, or other evaluation at the receivers. The payload data or process data can also be configured to transport the information they represent to one or more recipients.

In the exemplary embodiment shown here, data packet 1 comprises exactly one CRC value 5. This CRC value 5 is generated using a CRC polynomial from data 4 and header 2, 3. In the exemplary embodiment shown here, only one CRC value 5 has been added into data packet 1 because the amount of data in the exemplary embodiment shown here is less than 2048 bytes. That is, in the exemplary embodiment shown here, a CRC polynomial is used which has a Hamming distance with which a CRC value 5 can be uniquely established for at least 2048 bytes. When data packet 1 is generated, a counter value was initialized first, for example, to a multiple of a reference value, i.e., to a multiple of 2048 bytes or to the length of data packet 1. Then, the units of data 4 were counted. In this case, the counter value has not reached the reference value of 2048 bytes before the end of data 4 or the biunique bit pattern 2 was reached. CRC value 5 has accordingly been generated over the entire data 4 and header 2, 3 and added to data 4.

Figure 2:
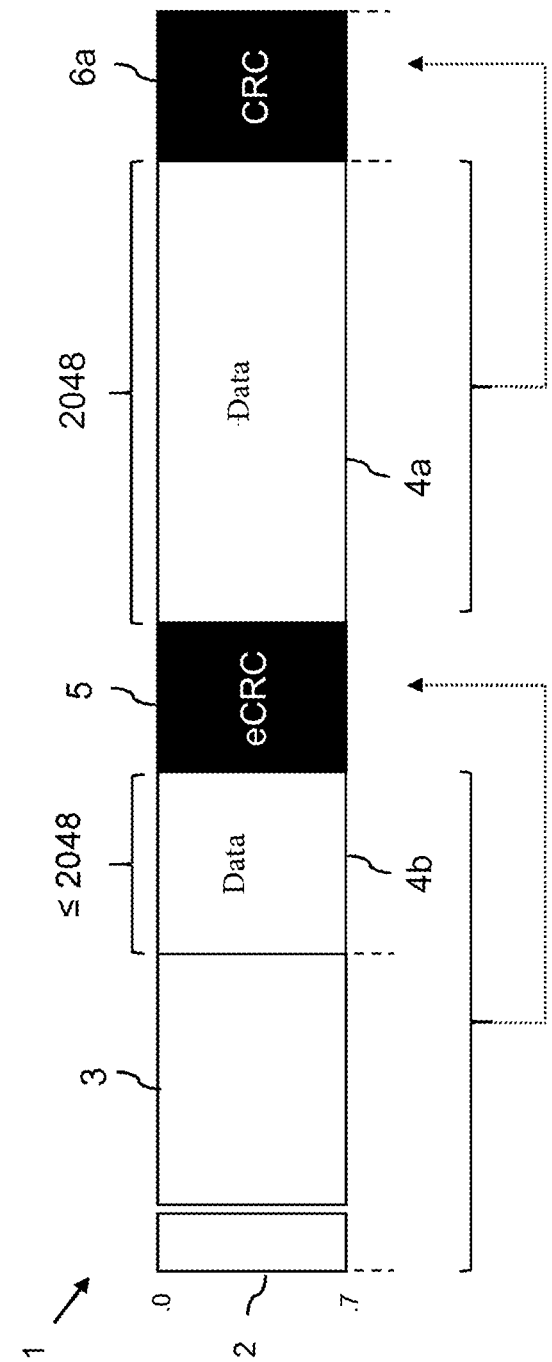
FIG. 2 shows an exemplary data packet with two CRC values.

FIG. 2 shows by way of example a data packet 1 with two inserted CRC values 5, 6a. In the exemplary embodiment shown here, data packet 1 contains more than the reference value of 2048 bytes of data 4. By counting data 4 with a counter value, when the counter value reaches a reference value, a first CRC value 6a is generated from the counted first data 4a. This first CRC value 6a is added to the counted data 4a. In the exemplary embodiment shown here, the remainder of data 4b is smaller than the reference value. Before the counter value thus again reaches the reference value, the end of data packet 1 is reached. Accordingly, a CRC value 5 is generated from the remaining data 4b and header 2, 3 of data packet 1. This CRC value 5 is appended to the remaining data 4b. In this way, a data packet 1 with two CRC values 5, 6a is formed, wherein the second CRC value 5 can be referred to as an embedded CRC value, therefore, an eCRC value, because it is inserted between data 4a, 4b. The two CRC values 5, 6a can be generated with the same CRC polynomial but differ based on the data on the basis of which they are generated. CRC value 6a is based on data 4a and eCRC value 5 is based on data 4b and in the exemplary embodiment shown here also on header 2, 3. It is clear to the skilled artisan that although it is described here that both CRC values 5, 6a were generated using the same CRC polynomial, different CRC polynomials can also be used here.

Figure 3:
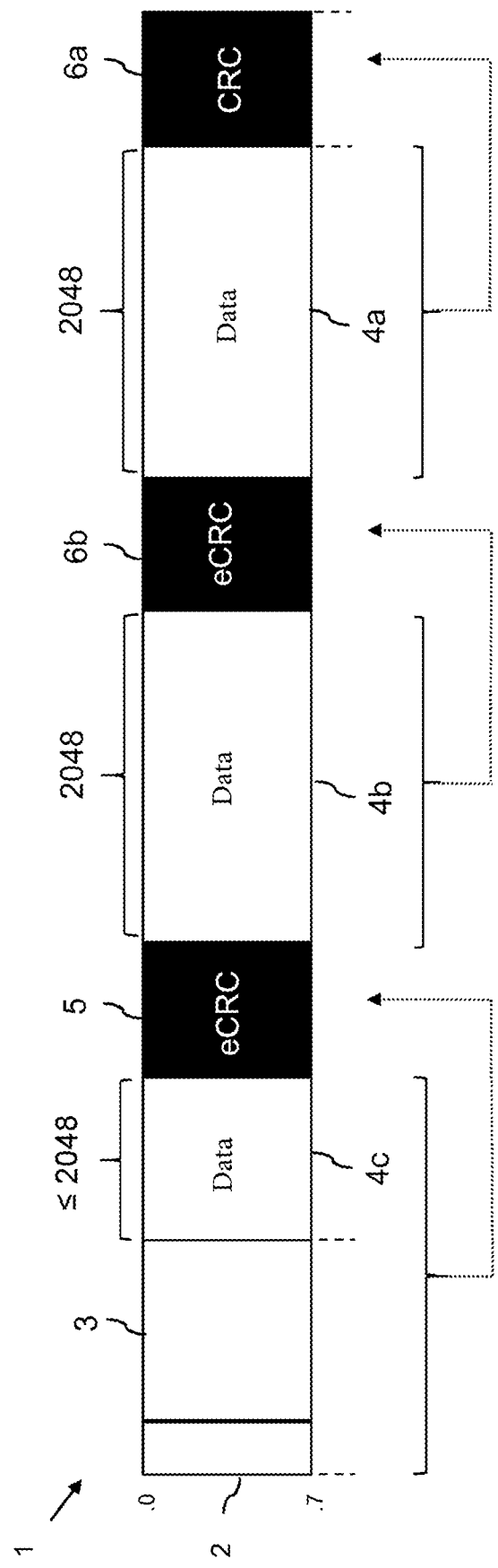
FIG. 3 shows an exemplary data packet with three CRC values.

FIG. 3 shows by way of example a data packet 1 with three CRC values 5, 6a, 6b, wherein at least two of the three CRC values 5, 6b are embedded CRC values 5, 6b. In the generation of data packet 1, a counter value was set, for example, to a multiple of the reference value, for example, to 6144 bytes (3×2048 bytes). However, the skilled artisan is aware that the counter value can be set arbitrarily and, for example, can be set to the length of the data packet, if this is known.

In the exemplary embodiment shown here, the counter value is decremented for each byte of data 4 in data packet 1. To simplify the counting of data 4, the counting can be binary and the least significant positions in the binary representation of the counter value can be used to perform a zero-crossing comparison. That is, whenever all least significant positions in the binary representation of the counter value are equal to zero, an amount of data 4 corresponding to the reference value has been counted. This zero-crossing comparison is shown by way of example in Table 1.

TABLE 1

| 6144 bytes | 1100000000000 |
|---|---|
| ... | |
| 4097 bytes | 1000000000001 |
| 4096 bytes | 1000000000000 |
| 4095 bytes | 0111111111111 |
| ... | |
| 2049 bytes | 0100000000001 |
| 2048 bytes | 0100000000000 |
| 2047 bytes | 0011111111111 |

Table 1 here starts from an initialized counter value of 6144 bytes. A total of 13 positions are necessary for the binary representation of this value. However, only the least significant positions are always considered, wherein the number of least significant positions corresponds to the number of least significant positions necessary for representing the reference value. The reference value in this case can correspond to the Hamming distance of the CRC polynomial used. In the exemplary embodiment shown here, the reference value can be represented with 12 positions (Hamming distance of 2048 bytes); i.e., 11 positions are the least significant positions and thus relevant. If the counter value of 6144 bytes is decremented, the last 11 positions undergo a zero-crossing at exactly 4096 bytes as well as at 2048 bytes and 0 bytes. Thus, when these zero-crossings occur, therefore exactly the number of data 4 corresponding to the reference value was always counted. In the exemplary embodiment shown here, the counter value was initialized with 6144 bytes, and at the first zero-crossing the CRC value 6a was added. This was generated over data 4a. At the second zero-crossing, the eCRC value 6b was added. This was generated over data 4b. There is no longer a further zero-crossing in the exemplary embodiment shown here because the remaining data 4c are less than 2048 bytes. This means that the end of data 4 is already reached or the end of data packet 1 is indicated by the biunique bit pattern 2 before the counter value again undergoes a zero-crossing. The further eCRC value 5 is accordingly generated over the remaining data 4c and header 2, 3 and added to data 4c.

In the exemplary embodiments shown in FIGS. 1 to 3, a reference value of 2048 bytes is used. However, the skilled artisan is aware that a different reference value can also be used that is selected according to the Hamming distance of the selected CRC polynomial. In the exemplary embodiments shown here, only a specific reference value was specified in order to simplify the description. However, this is not to be understood as limiting and any reference value is conceivable under the aforementioned conditions. Furthermore, the skilled artisan is aware that, even if in the exemplary embodiments shown, the entire header 2, 3 of data packet 1 has been taken into account for generating the eCRC value 5 to be added last, this value can also be generated only over payload data 4, without header 2, 3. It is also conceivable that the eCRC value 5 to be added last is generated only over part of header 2, 3, for example, control data 3, but not over the biunique bit pattern 2. Further, the skilled artisan is familiar with the fact that although a zero-crossing comparison is used here to detect that a particular amount of data 4 has been counted, a one-crossing comparison can also be used if, for example, the counter value is not decremented but incremented. Thus, if it is counted from zero, all ones at the least significant positions of the binary representation of the counter value indicate that the reference value has been reached. This can be seen, for example, in Table 1. If it is counted from zero, the least significant positions at 2047 and 4095 bytes, etc., are always made up of all ones. These can be used to indicate that an amount of data corresponding to the reference value was counted. Furthermore, the skilled artisan is aware that even if a multiple of the reference value was used here as the starting value for the counter value, the counter value can also be set as a function of the length of data packet 1, provided this length is known.

Figure 4:
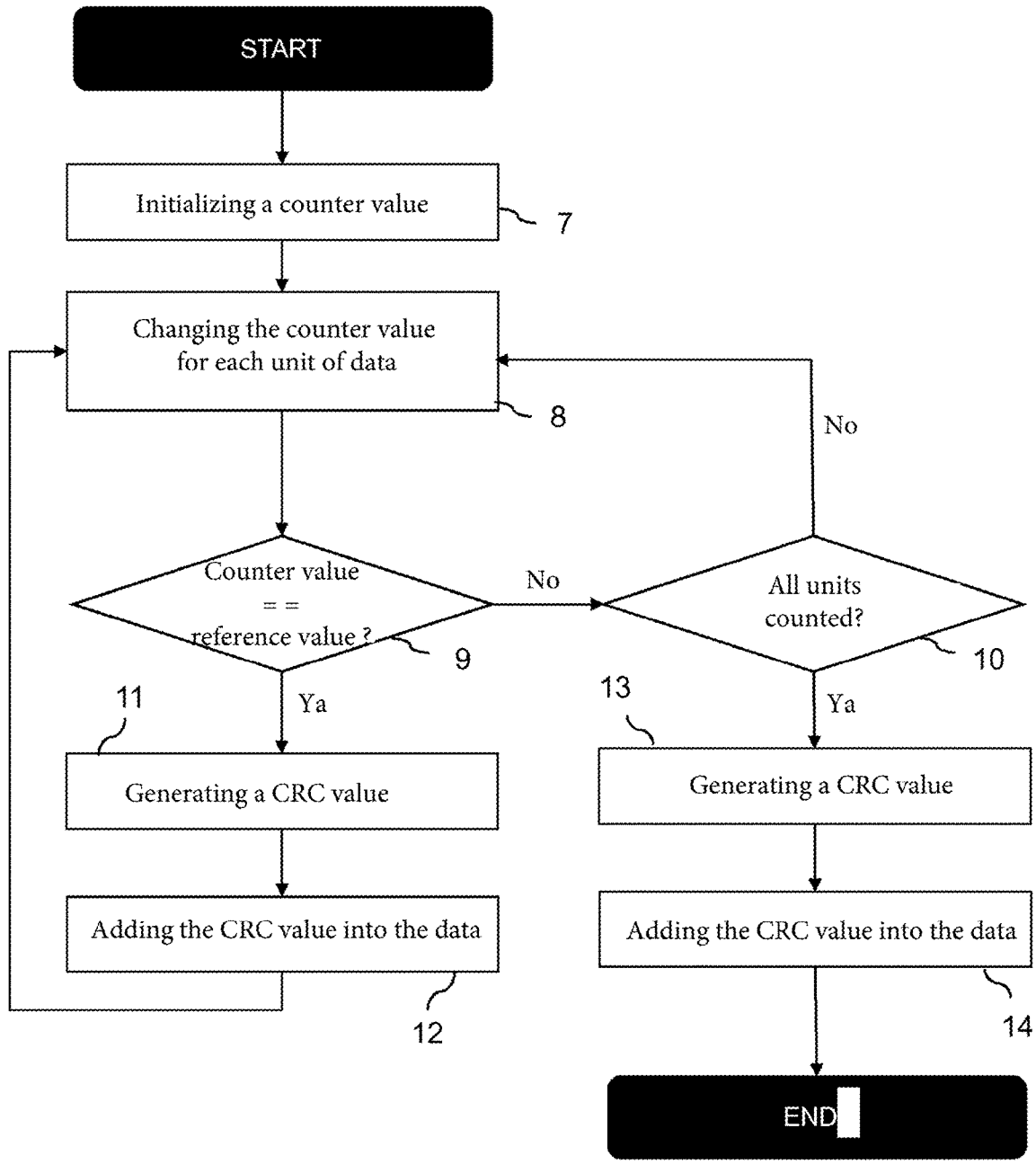
FIG. 4 shows an exemplary method of the invention for generating a data packet with one or more CRC values.

FIG. 4 shows by way of example the steps of the method of the invention for generating a data packet 1, as shown in FIGS. 1 to 3, with one or more CRC values 5, 6 in a flow chart. In this case, in the first step 7, a counter value is initialized, for example, to a multiple of a reference value, that is, to a multiple of a Hamming distance of a CRC polynomial used or to the length of data packet 1. Next, in step 8, units of data 4 in data packet 1 are counted and the counter value for each unit of data 4 is changed. The change in this case can include decrementing or incrementing the counter value. The units of data 4 can be, for example, bytes. It may also be that only payload data are counted and control data that form header 2, 3 of the data packet are not taken into account in the counting because, for example, they have only a small number of bytes. Next, in step 9, the counter value is compared with a reference value. The reference value in this case can indicate the amount of units of data 4 that still lead to a unique CRC value 5, 6 with the selected CRC polynomial. However, the reference value can also be chosen to be slightly smaller than the maximum amount of units of data 4 that still lead to a unique CRC value 5, 6 with the selected CRC polynomial, in order to increase the certainty that an error can be detected using the CRC value 5, 6. If the counter value does not correspond to the reference value, a check is carried out in step 10 as to whether all data 4 of data packet 1 were already counted. This check can include, for example, comparing the last unit of data 4 with a biunique known bit pattern which indicates the start of data packet 1. If this check is negative, therefore, if the end of data packet 1 has not yet been reached, then the method repeats step 8 again, that is, it changes the counter value, i.e., counts a further unit of data 4. The end of the data packet can also be detected, for example, by the known length of data packet 1. Next, it is again checked in step 9 whether the counter value corresponds to a reference value. If this is not the case, it is again checked in step 10 whether the end of data packet 1 has been reached. Steps 8, 9, and 10 are repeated until either the check in step 9 or the check in step 10 is positive.

In the event that the check in step 9 is positive, then a CRC value 6a, 6b is generated in step 11 and only over the counted units of data 4a, 4b. This generated CRC value 6a, 6b is then added into data packet 1 in step 12. In this case, the CRC value 6a, 6b can be added before or after the counted units of data 4a, 4b. Next, the method returns to step 8 again and counts further units of data 4; i.e., the counter value changes for each further unit of data 4.

In the event that the check in step 10 is positive, i.e., the end of data packet 1 has been reached, then a CRC value 5 is generated in step 13 over the quantity of the last counted units of data 4. This CRC value 5 can also be generated over the data including header 2, 3 of data packet 1. This generated CRC value 5 is then added into data packet 1 in step 14. That is, the CRC value 5 is either added before or after the last counted data 4. The method is ended when the end of data packet 1 is reached.

Figure 5:
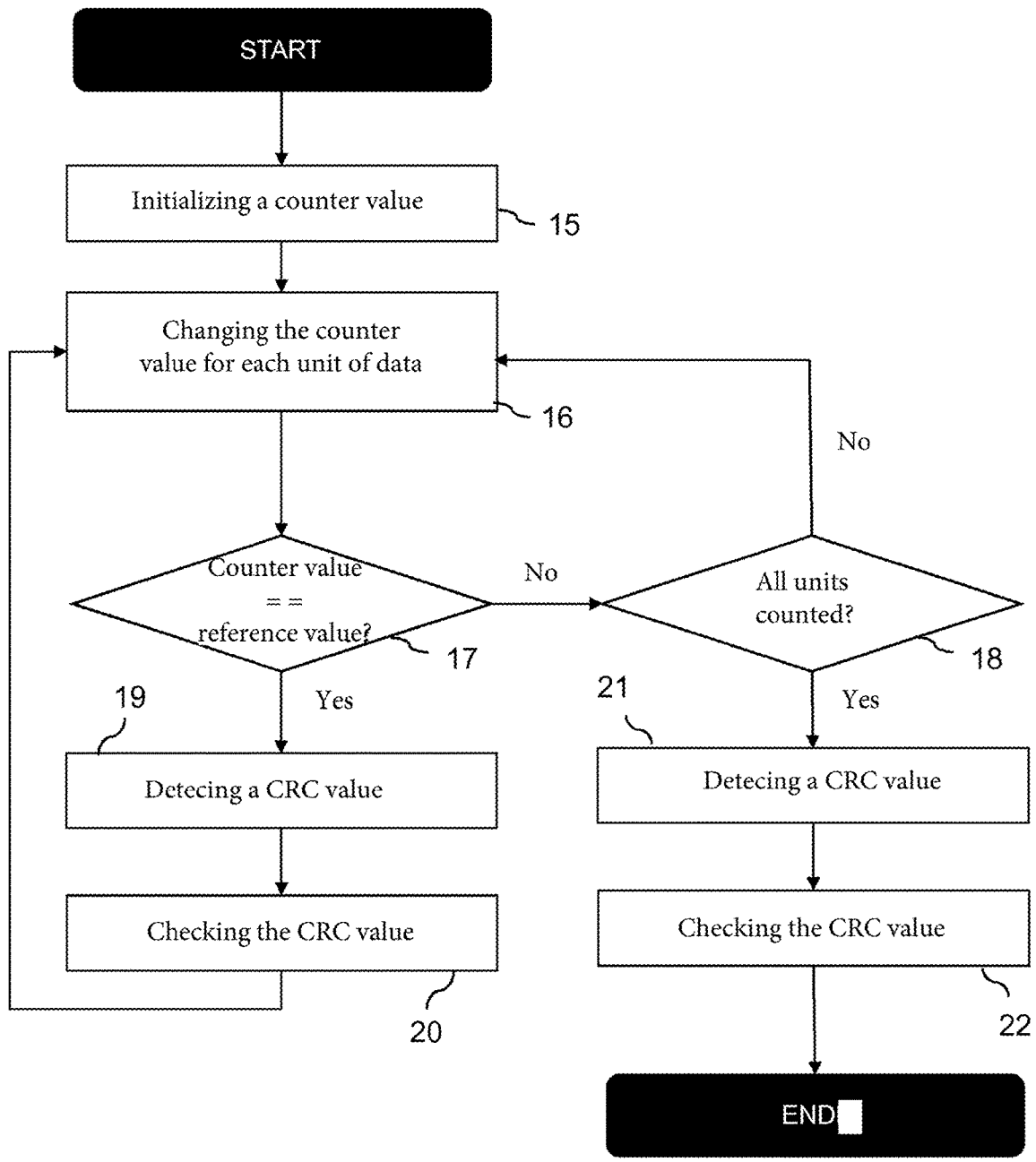
FIG. 5 shows an exemplary method of the invention for checking a data packet with one or more CRC values.

FIG. 5 shows by way of example the steps of the method of the invention for checking a data packet 1, as shown in FIGS. 1 to 3, with one or more CRC values 5, 6 in a flow chart. In this case, in the first step 15, a counter value is initialized, for example, to a multiple of a reference value, that is, to a multiple of a Hamming distance of a CRC polynomial used or to the length of data packet 1. Next, in step 16, units of data 4 in data packet 1 are counted and the counter value changes for each unit of data 4. The change in this case can include decrementing or incrementing the counter value. The units of data 4 can be, for example, bytes. Next, in step 17, the counter value is compared with a reference value. The reference value in this case can indicate an amount of units of data 4 that still lead to a unique CRC value 5, 6 with the selected CRC polynomial. However, the reference value can also be chosen to be slightly smaller than the maximum amount of units of data 4 that still lead to a unique CRC value 5, 6 with the selected CRC polynomial, in order to increase the certainty that an error can be detected using the CRC value 5, 6. If the counter value does not correspond to the reference value, a check is carried out in step 18 as to whether all data of data packet 1 were already counted. This check can include, for example, comparing the last unit of data 4 with a biunique known bit pattern which indicates the start of data packet 1. If this check is negative, therefore, if the end of data packet 1 has not yet been reached, then the method repeats step 16 again, that is, it changes the counter value, i.e., counts a further unit of data 4. Next, it is again checked in step 17 whether the counter value corresponds to a reference value. If this is not the case, it is again checked in step 18 whether the end of data packet 1 has been reached. The end of data packet 1 can also be detected, for example, by the known length of data packet 1. Steps 16, 17, and 18 are repeated until either the check in step 17 or the check in step 18 is positive.

In the event that the check in step 17 is positive, thus in step 19, a CRC value 5, 6 in data 4 is detected and extracted. In the following step 20, a check of the data is then made with the counted data 4 and the extracted CRC value 5, 6. This may indicate that the data are faulty or error-free. In the event that an error was detected, the data packet can be discarded, for example.

In the event that the check in step 18 is positive, i.e., the end of data packet 1 is reached, thus in step 21 a CRC value 5 in data 4c is detected and extracted. In the following step 22, a check of data 4c is then made with the counted data 4c and the extracted CRC value 5. This may indicate that data 4c are faulty or error-free. The method is ended when the end of data packet 1 is reached.

Optionally, before the end of the method, a determination can be made as to whether data packet 1 is error-free or faulty. For example, it can be indicated which of the detected CRC values 5, 6 and the associated data 4 have an error. This information can be used to check how many parts of data packet 1 are faulty and these parts can be discarded, or the whole data packet 1 can be discarded. For example, the entire data packet 1 is discarded if the number of faulty data parts exceeds a limit value.

The embedded CRC values 5, 6 described in the above exemplary embodiments and the methods for generating corresponding data packets 1 or their checking are mostly used in ring bus communications, where the length of data packets 1 in a cycle frame can be variable and depends on the data 4 to be transported and the number of data bus users connected to the ring bus. An example of a ring bus used in an exemplary automation system is shown in FIG. 6.

Figure 6:
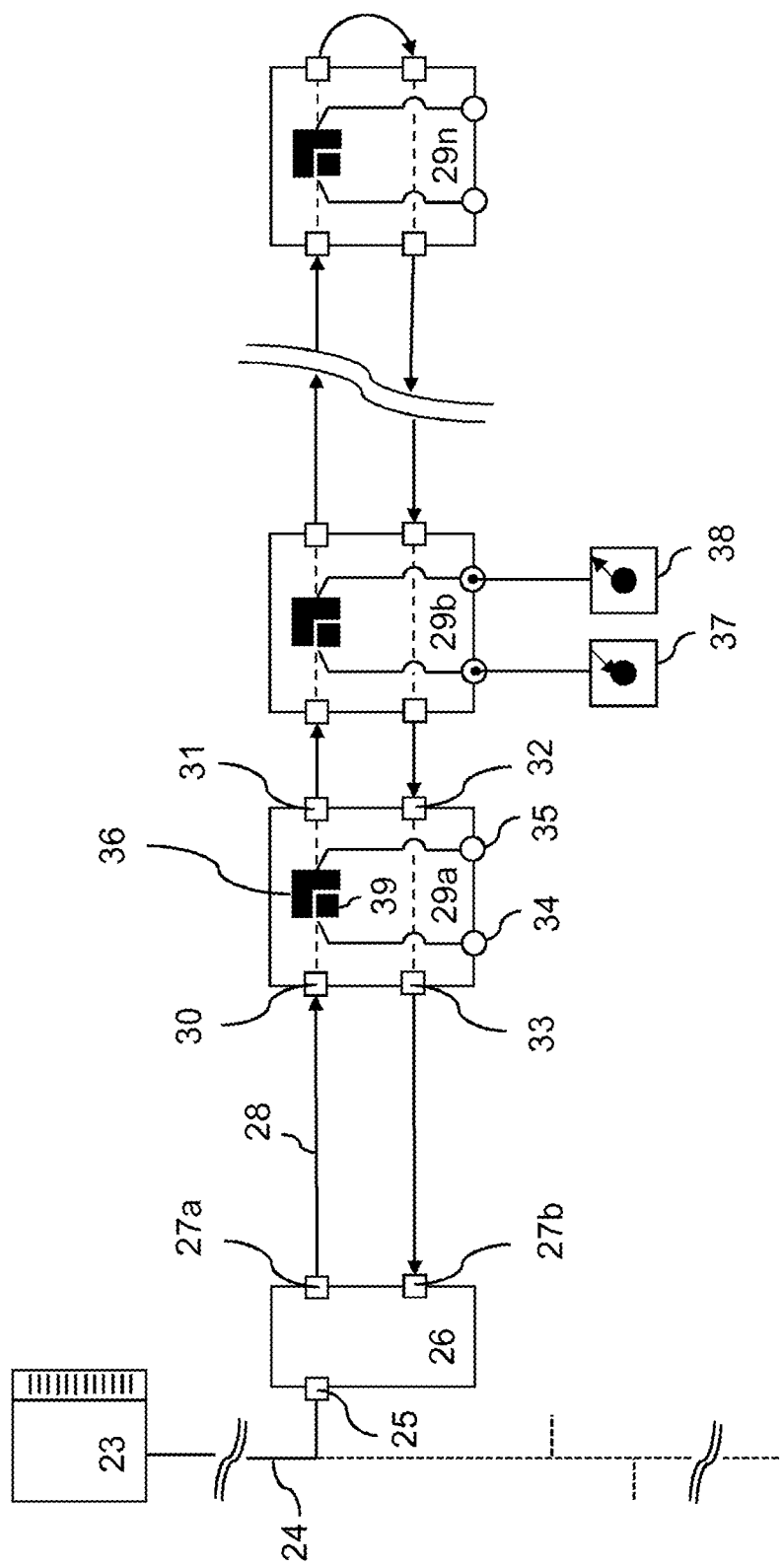
FIG. 6 shows a schematic block diagram of an exemplary automation system with a programmable logic controller, a higher-level bus, and multiple exemplary data bus users in which the data packets of the invention are used.

FIG. 6 shows a schematic block diagram of an automation system. The skilled artisan will understand that the automation system shown is only an example and all elements, modules, components, participants, and units belonging to the automation system can be configured differently but can nevertheless fulfill the basic functionalities described here.

The automation system shown in FIG. 6 has a higher-level controller 23, which can be realized, for example, with a programmable logic controller, PLC. Such a PLC 23 basically serves to control and regulate the process performed by the automation system. However, PLCs 23 in automation systems today also take on further functions, such as, for example, the visualization, alarming, and recording of all process-related data and, as such, PLC 23 functions as a human-machine interface. There are PLC 23 in different performance classes, which have different resources (computing capacity, memory capacity, number and type of inputs and outputs, and interfaces) that enable PLC 23 to control and regulate the process of the automation system. A PLC 23 usually has a modular design and formed of individual components, each fulfilling a different task. Typically, a PLC 23 formed of a central computer module (with one or more main processors and memory modules) and multiple modules with inputs and outputs. Such modular PLC 23 can be easily extended by adding modules. In this regard, the modules that must be integrated into PLC 23 depend on the complexity of the process and the complexity of the design of the automation system. In today's automation systems, PLC 23 is also usually no longer an independent system, but PLC 23 is connected via appropriate interfaces to the Internet or intranet. This means that PLC 23 is part of a network via which or from which PLC 23 can obtain information, instructions, programming, etc. For example, PLC 23 can receive information about the materials supplied about the process via a connection to a computer located on the intranet or Internet, so that the process can be optimally controlled, for example, by knowing their number or nature. It is also conceivable that PLC 23 is controlled by a user via access from the intranet or Internet. For example, a user with the aid of a computer, also called host computer, can access PLC 23 and check, change, or correct its user programming. Accordingly, access to PLC 23 from one or more remote maintenance or control centers is possible. If applicable, the host computers can have visualization devices for the representation of process sequences.

To control the process of the automation system, PLC 23 is connected to automation devices. In order to keep the wiring costs low, bus systems are used for these connections. In the exemplary embodiment shown in FIG. 6, PLC 23 is connected to a local bus master 26 of a lower-level local bus system by means of a higher-level bus 24, which in the exemplary embodiment shown here can be a fieldbus. However, it is possible to connect not only a local bus master 26 of a local bus to the higher-level bus 24, as in the exemplary embodiment shown here, but also any other user designed for communication with PLC 23.

In the exemplary embodiment shown here, the higher-level bus 24 is connected to local bus master 26. For this purpose, local bus master 26 has a first interface 25, which is configured such that it can be connected to higher-level bus 24. For this purpose, interface 25 can have, for example, a receptacle in the form of a jack and the higher-level bus 24 can have a plug which can be received by the jack. In this case, the plug and the jack can be, for example, a modular plug and a modular jack; i.e., each wire of higher-level bus 24 is electrically or optically connected to a connection in the modular jack. However, the skilled artisan is also familiar with other options for configuring an interface 25, so that local bus master 26 can be electrically or optically connected to higher-level bus 24. The skilled artisan in this regard is familiar with screw, rotary, click, or plug connections, with the help of which an electrical or optical connection can be made. In most cases, a male plug is received by a female counterpart. This receiving usually does not only produce the electrical or optical connection, but also ensures that the two parts are mechanically coupled and can only be disconnected from one another again with the application of a certain force. It is also conceivable, however, that the higher-level bus 24 is hardwired to interface 25.

Local bus master 26 in the exemplary embodiment shown here has a further second interface to connect local bus master 26 to the local bus, wherein the local bus is configured as a ring bus 28 in the exemplary embodiment shown here. In this case, the second interface is divided into a first part 27a and a second part 27b. The first part 27a of the second interface establishes the downlink in ring bus 28 and the second part 27b of the second interface establishes the uplink in ring bus 28.

Ring bus 28, whose data transmission direction is shown with arrows in the exemplary embodiment shown in FIG. 6, has a plurality of data bus users 29a, 29b, . . . , 29n in the exemplary embodiment shown here. In the exemplary embodiment shown here, these data bus users 29a, 29b, . . . , 29n each have an interface 30 for receiving data from an upstream or preceding data bus user 29a, 29b, . . . , 29n. In the case of data bus user 29a, it receives data from the upstream local bus master 26 via interface 30. Further, in the exemplary embodiment shown here, data bus users 29a, 29b, . . . , 29n each have an interface 31 for forwarding data to a downstream or subsequent data bus user 29a, 29b, . . . , 29n. In the case of data bus user 29a, it sends data to the downstream data bus user 29b via interface 31. Interfaces 30 and 31 are used to propagate data in the downward direction of ring bus 28, i.e., away from local bus master 26. Furthermore, in this exemplary embodiment, data bus users 29a, 29b, . . . , 29n also have interfaces 32 and 33 for propagating data in the upward direction of ring bus 28, i.e., to local bus master 26. In the case of data bus user 29a, interface 32 is configured to receive data from the downstream or subsequent data bus user 29b, and interface 33 is configured to forward data to the upstream or preceding data bus user, here local bus master 26. It can therefore also be stated that interfaces 31 and 33 are transmitter interfaces, whereas interfaces 30 and 31 are receiver interfaces.

In the exemplary embodiment shown here, the connections of the interfaces and PLC 23 or data bus users 29a, 29b, . . . , 29n are realized using cables or printed circuit boards and/or for direct or indirect contacting by means of electrical contacts. Another alternative is that the individual connections are made wirelessly, and the interfaces provide the necessary conversions to the wireless standards used.

Even if local bus master 26 and the individual data bus users 29a, 29b, . . . , 29n are shown spaced apart from one another in the exemplary embodiment shown here, i.e., local bus master 26 is arranged in a decentralized manner from data bus users 29a, 29b, . . . , 29n, the skilled artisan is aware that data bus users 29a, 29b, . . . , 29n and local bus master 26, which also represents a data bus user of ring bus 28, can also be directly connected to one another. In this case, for example, contacts of a data bus user can engage in corresponding receptacles or receptacle contacts of a directly adjacent data bus user, so as to establish an electrical connection between the data bus users so that data can be transmitted in the downward and upward direction. For example, data bus users 29a, 29b, . . . , 29n can have receptacles on the side facing away from the master and contacts on the side facing the master. If data bus users 29a, 29b, . . . , 29n are then lined up correspondingly, then the contacts of the one data bus user 29a, 29b, . . . , 29n each engage in the receptacles of the other data bus user 29a, 29b, . . . , 29n and an electrical connection can be produced. Local bus master 26 then has corresponding contacts on the side that engages in the receptacles of the first data bus user 29a, so as to produce an electrical connection between interfaces 27a and 30 or interfaces 27b and 33. However, the skilled artisan is also familiar with other options, e.g., pressure contacts, knife and fork contacts, for two data bus users 29a, 29b, . . . , 29n arranged directly next to one another to be able to produce an electrical or optical connection by means of corresponding components.

In the event that data bus users 29a, 29b, . . . , 29n and local bus master 26 are to be connected directly to one another, they may also have mechanical receptacles or mechanical fasteners with which individual data bus users 29a, 29b, . . . , 29n and local bus master 26 can be connected to one another. In this case, for example, a data bus user 29a, 29b, . . . , 29n can have a projection on one side and an undercut on the other side. If data bus users 29a, 29b, . . . , 29n are then lined up, then a projection engages in an undercut of the other data bus user 29a, 29b, . . . , 29n, so that a mechanical coupling is formed. For a simple lining up of data bus users 29a, 29b, . . . , 29n, these can also be arranged on a common support, for example, a top-hat rail. For attachment to the top-hat rail, data bus users 29a, 29b, . . . , 29n can have appropriate fasteners. Alternatively or additionally, data bus users 29a, 29b, . . . , 29n can also have, for example, detachably connectable fasteners with which data bus users 29a, 29b, . . . , 29n can be fastened either to the top-hat rail or to another support. For this purpose, the detachably connectable fasteners can be interchangeable and appropriate fasteners for the desired support can be connected to data bus users 29a, 29b, . . . , 29n, so that they can be fastened to the desired support.

Furthermore, data bus users 29a, 29b, . . . , 29n also have a processing unit 36 in the exemplary embodiment shown in FIG. 6. This processing unit 36 may be an arithmetic logic unit or another type of arithmetic unit with the aid of which data can be processed. Processing unit 36 is preferably an integral part of data bus user 29a, 29b, . . . , 29n in order to ensure a particularly fast and time-synchronized processing of the data.

Processing unit 36 can also be referred to as the entire circuit of the data bus user. That is, processing unit 36 receives data via inputs 30 and 32 and outputs data to outputs 31 and 33. Furthermore, processing unit 36 can receive or output data from inputs and outputs 34 and 35, respectively. Furthermore, processing unit 36 has access to a memory 39 of data bus user 29a, 29b, . . . , 29n in which, for example, data, process data, or instruction lists are stored.

Processing unit 36 can be configured to process received data and to output data. Data to be processed can be received either from an upstream data bus user or from inputs 34 of data bus user 29a, 29b, . . . , 29n. In this case, inputs 34 of data bus user 29a, 29b, . . . , 29n can be connected to sensors 37, which transmit, for example, measurement data, status data, etc. Processed data can be output either to a downstream data bus user or to outputs 35 of data bus user 29a, 29b, . . . , 29n. In this case, outputs 35 of data bus user 29a, 29b, . . . , 29n can be connected to actuators 38, which perform a specific action, for example, using the data directed to them. If data processing is also to take place in the upward direction, data can also be received from a downstream data bus user 29a, 29b, . . . , 29n and processed data sent to an upstream data bus user 29a, 29b, . . . , 29n.

For the sake of simplicity, in the exemplary embodiment shown here, data bus users 29a, 29b, . . . , 29n are shown only with one input 34 and one output 35, and also only data bus user 29b is connected to sensor 37 and actuator 38. However, the skilled artisan is aware that data bus users 29a, 29b, . . . , 29n can have a plurality of inputs and outputs 34 and 35 and can be connected to a plurality of different sensors 37 and actuators 38. In this case, the feature characterizing the sensors 37 is that sensors 37 receive data and send them to data bus users 29a, 29b, . . . , 29n, whereas actuators 38 receive data from data bus users 29a, 29b, . . . , 29n and execute an action based on these data.

Alternatively, interfaces 30, 31, 32, and 22 can be integrated in a module unit and data bus users 7a, 7b, 7n can be plugged onto this module unit. The module units can also be referred to as basic elements of ring bus 28. The ring bus infrastructure is thereby made up of the module units and data bus users 29a, 29b, . . . , 29n are interchangeable, so that ring bus 28 can be made up of any data bus users 29a, 29b, . . . , 29n. It is also ensured with the aid of the module units that even if a data bus user 29a, 29b, . . . , 29n is removed, the communication between the remaining data bus users 29a, 29b, . . . , 29n is not interrupted because the communication takes place via the still remaining module units.

The data bus users 29a, 29b, . . . , 29n shown in this exemplary embodiment are also frequently referred to as I/O modules because of their inputs and outputs 34, 35, which can be connected to sensors 37 or actuators 38, respectively. Even if in the exemplary embodiment shown here data bus users 29a, 29b, . . . , 29n are shown as spatially separated from sensors 37 or actuators 38, sensors 37 or actuators 38 can also be integrated in the I/O module.

The ring bus 28 shown in the exemplary embodiment shown here is based on a cyclically repeating sequence of data packets or telegrams often referred to as cycle frame communication. In this case, local bus master 26 generates cycle frames, for example, in which one or more data packets with a header, a process data part, or information data part and a test part are included. The process data part or information data part of the data packet can have payload, control, and process data, as shown in FIGS. 1 to 3. The one or more cycle frames are sent from local bus master 26 in the downward direction to first data bus 29a of ring bus 28. This receives a first part of a data packet in the cycle frame via interface 30. Such a part of the data packet is also referred to below as a piece or unit or symbol. Data bus user 29a then carries out a processing of the part, and then forwards the part to the next data bus user 29b via interface 31; first data bus user 29a preferably receives a second part of the data packet at the same time, etc. The size of the parts of the data packet, therefore, the splitting up of the data packet, depends on the receiving capacity of data bus user 29a, 29b, . . . , 29n; for example, a fixed number of bits, for example, 8 bits of the data packet can be present simultaneously at data bus user 29a, 29b, . . . , 29n for processing.

Accordingly, the data packet passes through data bus users 29a, 29b, . . . , 29n in units, pieces, or parts, for example, in parts or symbols of 8 bits. The part of the data packet which has been processed by the last data bus user, in the exemplary embodiment shown here data bus user 29n, then passes in the upward direction through ring bus 28, so that the parts originating from the last data bus user 29n are again sent in the direction of local bus master 26 by all data bus users 29a, 29b, . . . , 29n. For this purpose, the last data bus user 29n either has a switchable bridge that connects interface 31 to interface 32 or a switchable bridge is connected to last data bus user 27n, which takes over the function of passing parts of the data packet from interface 31 to interface 32. Alternatively, interface 32 of data bus user 27n can also be connected directly to interface 27b of local bus master 26 using a bypass line.

In the upward direction, the data packets of the cycle frame, as in the exemplary embodiment shown here, can be looped back to local bus master 26 through the individual data bus users 29a, 29b, . . . , 29n without any further processing taking place. However, it is also conceivable that processing of the data packets of the cycle frame takes place in the upward direction again, so that the data packets of the cycle frame can be processed twice, once in the downward direction to the last data bus user 29n and once in the upward direction to local bus master 26. For example, processing in the upward direction can occur by signal refreshing and/or phase shifting.

The data packets contained in the cycle frame can have the embedded CRC values as shown in FIGS. 1 to 3. In this case, the CRC values can be added into the data packets by local bus master 26 when the cycle frame is generated, and, on the one hand, enable local bus master 26 to detect in the upward direction whether errors in the data transmission of a data packet have taken place in the cycle frame; on the other hand, these CRC values also allow data bus users 29a, 29b, . . . , 29n in each case to always check only a part of the data packets, namely the part over which the CRC value was generated instead of first the entire data pack having to be present. This is particularly advantageous in the described symbol-wise transmission of the data packet in the cycle frame.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for generating a data packet to be transmitted, the data packet comprising data and at least one value for a cyclic redundancy check (CRC) value, the CRC value being generated uses at least one previously determined polynomial on the basis of at least some of the data, the method comprising:
   initializing a counter value;
   counting units of data, wherein the counter value changes for each unit of data; and
   adding a CRC value into the data packet, when the counter value reaches a reference value or all units of data in the data packet have already been counted,
   wherein the CRC value is generated over the units of data which have been counted since the counter value last reached the reference value or since the counter value was initialized.

2. The method according to claim 1, wherein a CRC value is added into the data packet each immediately adjacent to the units of data on the basis of which the CRC value is generated.

3. The method according to claim 1, wherein a unit of data is a fixed number of bits or a byte.

4. The method according to claim 1, wherein the counter value is set to a previously determined binary value at initialization, and wherein, when the units of data are counted, the counter value is decremented and the reference value has only zero values which are compared with the least significant positions of the counter value.

5. The method according to claim 1, wherein at least two CRC values are generated using the same polynomial.

6. The method according to claim 1, wherein the CRC value is generated using a Castagnoli polynomial.

7. The method according to claim 1, wherein the data comprises payload data and/or header data.

8. The method according to claim 1, wherein the data packet is contained in a cycle frame.

9. A device for generating a data packet to be transmitted comprising data and at least one value for a cyclic redundancy check (CRC) value, the CRC value being generated using at least one previously determined polynomial based on at least some of the data, the device comprising:
   an initializer to initialize a counter value;

a counter to count units of data, the counter being adapted to change a counter value based on the counted units of data;

a generator to generate a CRC value over the counted units of data since the counter value last reached the reference value or the counter value was initialized; and an adder to add the CRC value into the data packet.

10. A method for checking a received data packet comprising data and at least one value for a cyclic redundancy check (CRC) value, a first CRC value being generated using at least one previously determined polynomial on the basis of at least a first part of the data, a second CRC value being generated using the previously determined polynomial based on at least a second part of the data, the method comprising:

initializing a counter value;

counting units of the first part of data from the received data packet, a counter value changing for each unit of data;

detecting the first CRC value in the data when the counter value reaches a reference value;

detecting the second CRC value in the data when all the units of data in the data packet have already been counted; and checking the detected CRC values.

11. The method according to claim 10, wherein the data packet was received without errors if all checks of the CRC values do not show any errors.

12. The method according to claim 10, wherein the counter value is set during initialization to a binary value, dependent on a length of the data packet, and wherein, when the units of data are counted, the counter value is decremented and the reference value only has zero values which are compared with the least significant positions of the counter value.

13. The method according to claim 10, wherein the checking of the CRC values is performed using the same polynomial.

14. The method according to claim 10, wherein the data packet is received in a cycle frame.

* * * * *